United States Patent
Lu et al.

(10) Patent No.: US 7,282,410 B2
(45) Date of Patent: Oct. 16, 2007

(54) FLASH MEMORY PROCESS WITH HIGH VOLTAGE LDMOS EMBEDDED

(75) Inventors: Hsiang-Tai Lu, Hsinchu (TW); Cheng-Hsiung Kuo, Hsinchu (TW); Chin-Huang Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 191 days.

(21) Appl. No.: 10/895,881

(22) Filed: Jul. 21, 2004

(65) Prior Publication Data

US 2006/0019444 A1   Jan. 26, 2006

(51) Int. Cl.
  *H01L 21/8247* (2006.01)
(52) U.S. Cl. ............... 438/257; 438/238; 257/E21.179
(58) Field of Classification Search ........ 438/257–267, 438/238; 257/E21.179
  See application file for complete search history.

(56) References Cited

U.S. PATENT DOCUMENTS

| | | | |
|---|---|---|---|
| 6,051,862 A | 4/2000 | Grimaldi et al. | |
| 6,200,859 B1* | 3/2001 | Huang et al. | 438/264 |
| 6,441,431 B1 | 8/2002 | Efland et al. | |
| 6,642,116 B2 | 11/2003 | Lin | |
| 6,713,349 B2 | 3/2004 | Lin et al. | |
| 6,713,811 B2 | 3/2004 | Hsieh | |
| 6,720,219 B2 | 4/2004 | Huang | |
| 6,933,197 B2* | 8/2005 | Iida | 438/264 |
| 2003/0064564 A1* | 4/2003 | Lin | 438/257 |
| 2004/0077144 A1 | 4/2004 | Hsieh | |

OTHER PUBLICATIONS

Pritiskutch, J., et al., "Understanding LDMOS Device Fundamentals," An1226 Application Note, STMicroelectronics, Jul. 2000.
Wolf, S., et al., "Silicon Processing for the VLSI Era, vol. 1: Process Technology," Lattice Press, 1986, p. 192.

* cited by examiner

*Primary Examiner*—Richard A. Booth
(74) *Attorney, Agent, or Firm*—Slater & Matsil, L.L.P.

(57) ABSTRACT

A method of embedding the forming of peripheral devices such as HV-LDMOS into the forming of flash memory is presented. A layered structure is formed with a first insulating layer formed on a substrate, and a poly silicon formed on the first insulating layer in the flash memory region. A mask layer is formed. Openings are formed in the flash memory region in the peripheral region. A local oxidation of silicon (LOCOS) is performed to form thick oxides on poly silicon, and a field oxide on silicon substrate respectively. The mask layer is removed. A control gate and a control gate oxide are formed on the thick oxide and the poly silicon. A gate electrode is formed with at least one end residing on a field oxide so that the resulting HV-LDMOS has a high breakdown voltage. Spacers and a source/drain of the flash cells and HV-LDMOSs are then formed.

27 Claims, 9 Drawing Sheets

FLASH MEMORY PROCESS WITH HIGH VOLTAGE LDMOS EMBEDDED

TECHNICAL FIELD

This invention relates generally to semiconductor devices, and more specifically to the manufacturing of flash memory and high voltage laterally diffused metal-oxide semiconductor devices.

BACKGROUND

Flash memory has become popular recently. A typical flash memory comprises a memory array having a large number of memory cells arranged in blocks. Each of the memory cells is fabricated as a field-effect transistor having a control gate and a floating gate. The floating gate is capable of holding a charge and is separated from source and drain regions contained in a substrate by a layer of thin oxide. Each of the memory cells can be electrically charged by injecting electrons from the drain region through the oxide layer onto the floating gate. The charge can be removed from the floating gate by tunneling the electrons to the source through the oxide layer during an erase operation. Thus the data in a memory cell is determined by the presence or absence of a charge on the floating gate.

Flash cells come in two major types, stack gate flash cells and split gate flash cells, as illustrated in FIGS. 1A and 1B. A stacked gate flash cell has a control gate 14 completely stacked on a floating gate 10. The control gate 14, floating gate 10 and substrate 2 are separated by insulating layers. A split gate flash memory has a control gate 22, which includes a first portion overlaying a floating gate 16 and a second portion directly overlaying the channel. The split gate flash exhibits an improved performance over the stacked gate flash. Specifically, the split gate flash can be constructed to prevent over-erasing that occurs in the stacked gate flash.

Flash memory is operated at high voltages for its read and write operations. The operation power is normally provided by laterally diffused metal-oxide semiconductor (LDMOS) devices that can provide higher power and have higher breakdown voltage than conventional MOS devices. However, the early generation of the LDMOS can only work at voltages up to about 14V. A high voltage LDMOS (HV-LDMOS) was then developed. FIG. 3 illustrates a typical HV-LDMOS. Besides the source 4 and drain 6, which a typical MOS has, the drain has an additional lightly doped drain (LDD) region 31 and the source has an additional sinker region 26. Region 28 is a drift region (also known as a threshold adjust region). Typically, the HV-LDMOS is built in an epitaxy (or implant) region 24, which is formed in substrate 2. The field oxides 38 are formed to increase the breakdown voltage. The reason that the LDMOS shown in FIG. 3 has higher breakdown voltage may be explained as follows. Although it appears that a device is broken down by a voltage applied to it, it is actually the electric field that breaks down the dielectric between the two nodes across which the voltage is applied. When a high voltage is applied between a source/drain and a gate, a strong electric field is generated between the source/drain and the gate. Therefore, by forming thick field oxides (FOX) 38 under the gate 40 and between the source/drain and the gate, where the electrical field is the strongest, the source/drain and the gate are effectively separated far away and the electrical field is lowered, therefore the breakdown voltage is increased.

In the past, flash memory and high voltage peripheral devices were either manufactured in separate chips, or in the same chip but by separate processes. However, it is considerably less expensive and higher performance can be derived from having the flash memory on the same substrate as the higher power and higher voltage devices. Also, it would be desirable to provide an HV-LDMOS while making little or no changes to a current process flow used in forming a flash memory.

A problem with this technique is that it can be quite difficult to simultaneously fabricate the lower power devices with the higher power devices. For instance, the gate dielectric on the lower power devices needs to be quite thin so that the threshold voltage of the device remains low and the switching speed of the device remains quite fast, but in order to be able to handle the higher voltages, the HV-LDMOS needs a thicker gate dielectric. What is needed, therefore, is a method of manufacturing HV-LDMOS devices that is compatible with standard flash memory processes.

SUMMARY OF THE INVENTION

The preferred embodiment of the present invention embeds the forming of flash cells and the forming of peripheral devices, including high voltage laterally diffused MOS (HV-LDMOS) and low-voltage devices. Various forming steps are combined so that production cost is lowered.

In accordance with one aspect of the present invention, a layered structure with a first insulating layer is formed on a silicon substrate, and a poly silicon (poly-1) is formed on the first insulating layer in the flash memory region. A mask layer is formed on the poly silicon. Openings are formed in the flash memory region to expose poly silicon, and openings are formed in the peripheral region to expose the silicon substrate. A local oxidation of silicon (LOCOS) is performed to form a thick oxide in the flash memory region and in the peripheral region simultaneously. The mask layer is removed. A second insulating layer is formed on the first insulating layer, the thick oxide and the poly silicon in the flash memory region. A conductive layer is formed in the flash memory region and peripheral region. In the flash memory region, the conductive layer is patterned to form the control gate of the flash cell. In the peripheral region, the conductive layer is patterned to form the poly gate of the HV-LDMOS. At least one end of the HV-LDMOS poly gate resides on the field oxide so that the LDMOS breakdown voltage is increased. The spacers and the source/drain of the flash cell and HV-LDMOS are then formed.

In accordance with yet another aspect of the present invention, both the poly silicon and the conductive layer may be formed and patterned in the peripheral region to form devices such as low-voltage MOS, resistors and capacitors. The process of forming such devices is also integrated with the forming of flash cells and HV-LDMOS.

The advantages of the present invention include but are not limited to: lower production cost due to less forming steps; higher performance due to integrated low voltage and high voltage devices; and higher breakdown voltage of the LDMOS. The breakdown voltage of the HV-LDMOS made by the preferred embodiment of the present invention is above 15V, and the breakdown voltage may be adjusted in a wide range based on the requirement without major changes to the forming process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments present a novel method of integrating the manufacturing of flash cells and higher voltage peripheral devices, such as high voltage laterally diffused MOS (HV-LDMOS) devices. The preferred embodiments combine various masks and forming steps by forming various elements of flash cells and HV-LDMOS devices at the same time. The flash cell could include stacked gate flash type or split gate flash type. The following method uses the split gate as an embodiment to illustrate the present invention.

The preferred embodiments are illustrated in FIGS. 4 through 11 wherein like reference numbers are used to designate like elements throughout the various views and illustrative embodiments of the present invention. Throughout the description, the location where the flash memory is formed is designated as the flash memory region, and the location where the peripheral devices are formed is designated as the peripheral region. Each figure number may be followed by a letter A, B or C, where A indicates that the devices are formed in the flash memory region and B or C indicates that the devices are formed in the peripheral region.

Figure 1:
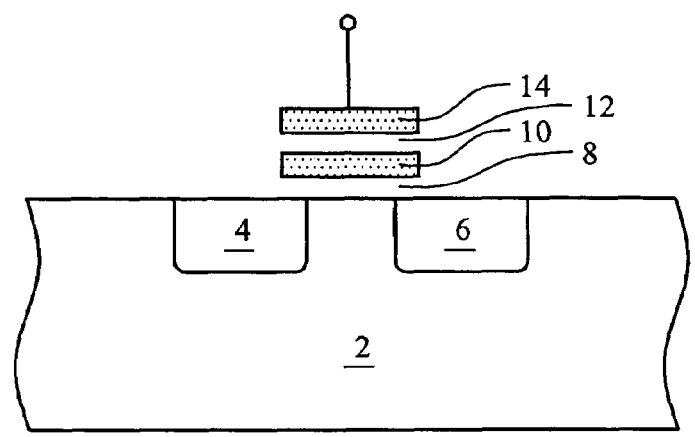
FIG. 1 is a cross-sectional view of a conventional stacked gate flash cell.
Figure 2:
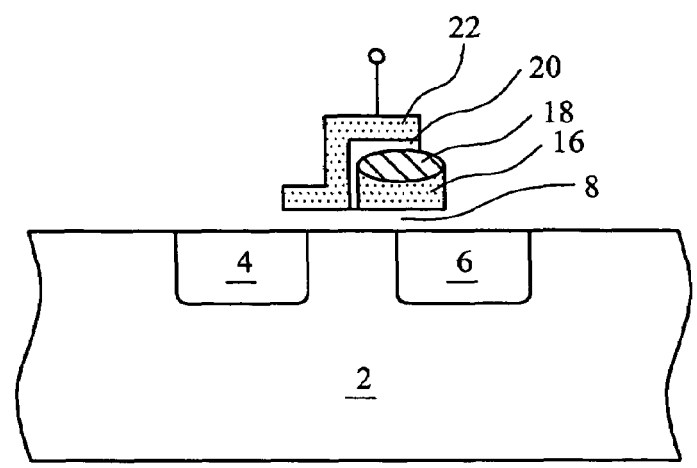
FIG. 2 is a cross-sectional view of a conventional split gate flash cell.
Figure 3:
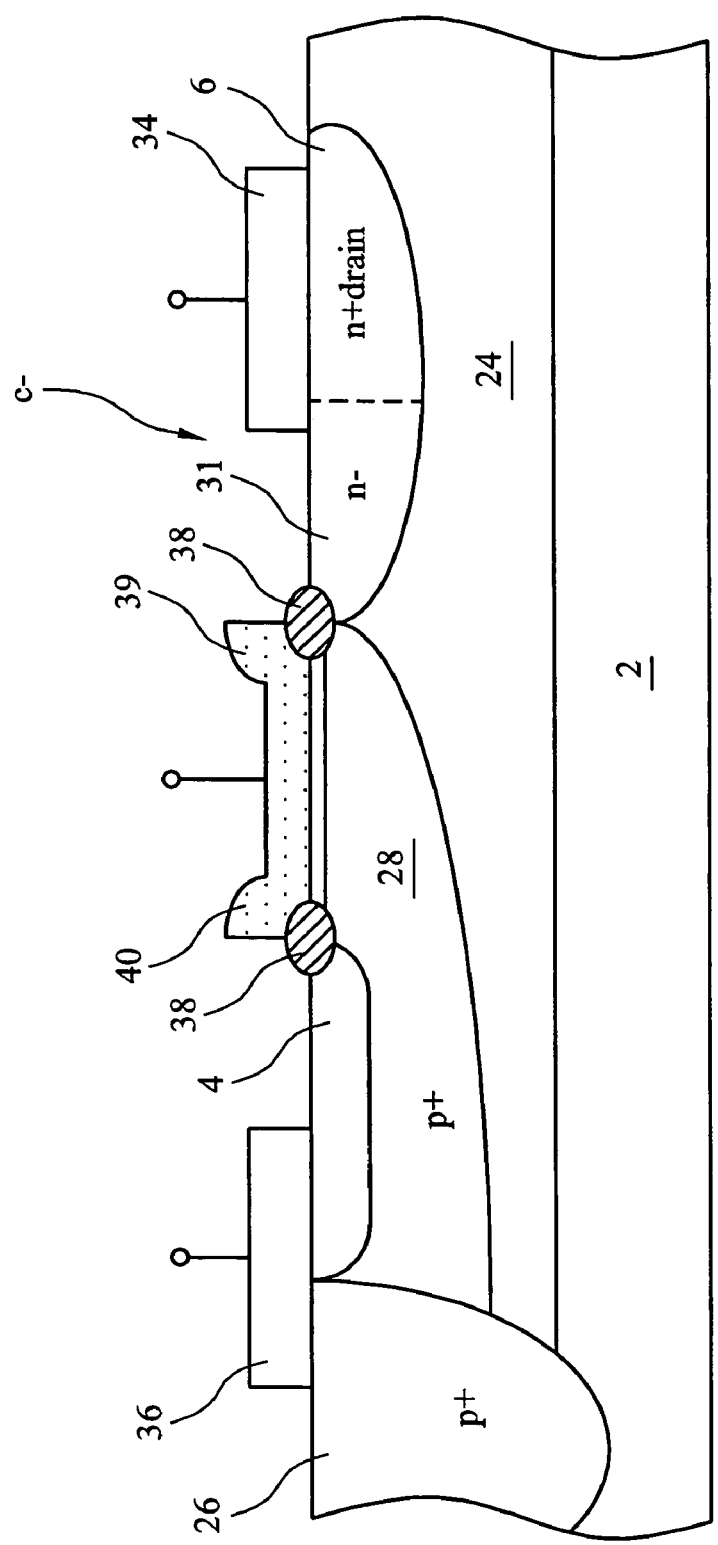
FIG. 3 is a cross-sectional view of a conventional high voltage LDMOS.
Figure 4A:
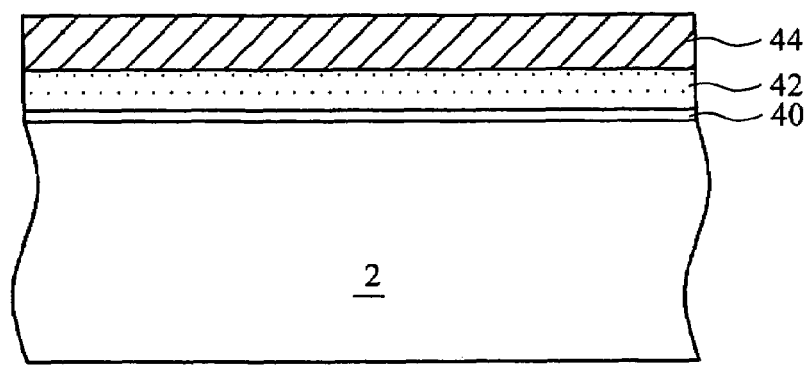
FIGS. 4 through 11 illustrate the cross-sectional views of the intermediate stages of forming a flash cell and HV-LDMOS.
Figure 4B:
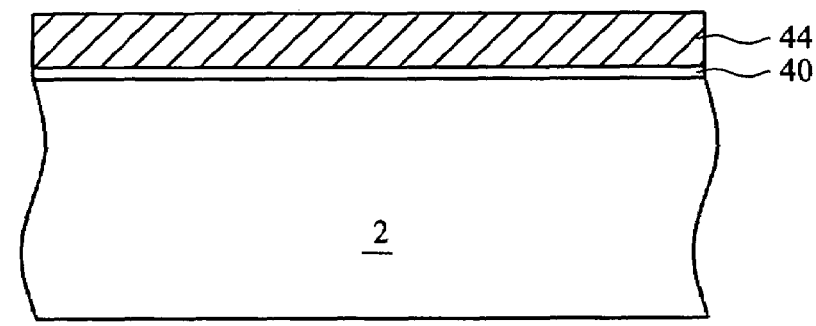

FIGS. 4A and 4B illustrate a stacked structure formed on a substrate 2. In the preferred embodiment, the substrate 2 is a silicon substrate. In other embodiments, substrate 2 may be formed of strained silicon, compound semiconductor, multi-layers of semiconductor, or other materials comprising silicon. Where an HV-LDMOS is formed, an epitaxy region and threshold adjust region (not shown) may be formed (refer to FIG. 3).

An insulating layer 40 is formed on substrate 2. The insulating layer 40 is preferably a silicon oxide formed using known methods, such as thermal oxidation, CVD, and the like. As the insulating layer 40 may be part of the devices subject to high voltages, it is desired for it to be thicker than the gate oxide of a low-voltage MOS transistor and the thickness depends on the voltage to be applied, the material, and the forming process, etc. The preferred thickness of the insulating layer 40 is about 60 Å to about 11 Å.

FIG. 4A also illustrates that a poly silicon 42 is formed on the insulating layer 40. The poly silicon 42 is widely known as poly-1 in the art of flash cells as it is the first poly silicon formed. The poly-1 42 may be deposited using chemical vapor deposition (CVD) or other known methods. The poly-1 42 is then doped to reduce sheet resistance.

In the preferred embodiment, a mask (not shown) covers all peripheral regions so that no poly-1 42 is formed in the peripheral region, as illustrated in FIG. 4B.

In other embodiments, poly-1 42 may be formed in selected locations of the peripheral region. This can be achieved by a mask covering portions of the peripheral region, so that poly-1 42 is formed only in the desired locations, or by blanket depositing poly-1 42 in the peripheral region, and then removing the undesired portions. The thickness of the poly-1 42 is related to the oxidation process and will be discussed later. The poly-1 42 formed in the peripheral region can be used to form devices such as capacitors (which are formed of a poly-1 42, insulating layer 40 and substrate 2), resistors (formed of strips of poly-1), MOS transistors (poly-1 is used as the gate poly), etc. It is to be noted that there is no thick field oxide under poly-1 42, so that the resulting MOS transistors work only at low voltages.

A mask layer 44 is then formed, also illustrated in FIG. 4A and FIG. 4B. In the flash memory region, mask layer 44 is formed on the poly-1 42. In the peripheral region, mask layer 44 is formed on the insulating layer 40. Preferably, the mask layer 44 is formed of silicon nitride since silicon nitride is useful as a masking layer for selective oxidation and it is difficult for oxygen to penetrate silicon nitride. Preferably the silicon nitride 44 is formed using low pressure CVD (LPCVD) at a temperature of about 700° C. to about 800° C. It can also be deposited by PECVD at a lower temperature of about 200° C. to about 400° C. The preferred thickness of the silicon nitride is about 100 nm to about 200 nm.

Figure 5A:
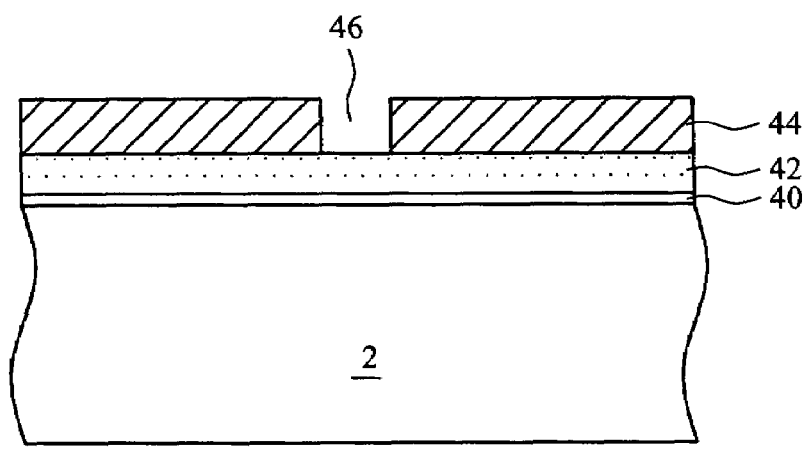
Figure 5B:
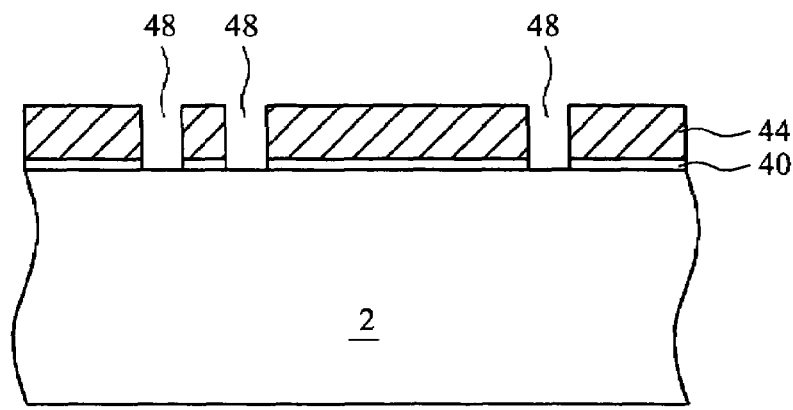

The mask layer 44 is then masked and patterned, as shown in FIG. 5A and FIG. 5B. The openings 46 and 48 can be formed by dry etching or other known methods. In the flash memory region, poly-1 42 is exposed. In the peripheral region, further etching is conducted in openings 48 to remove the insulating layer 40 and expose silicon substrate 2. It is desirable to use an etchant that attacks both the mask layer 44 and the insulating layer 40, but not the poly silicon 42 or the silicon substrate 2, so that the desired effect can be achieved in one step.

Although in the preferred embodiment, the first insulating layer 40 in the flash memory region is the same material formed at the same time as the first insulating layer 40 in the peripheral region, in other embodiments, they can be different materials formed at different times. Also, the mask layer 44 in the flash memory region may also be a different material and formed at a different time from the mask layer 44 in the peripheral region.

Figure 6A:
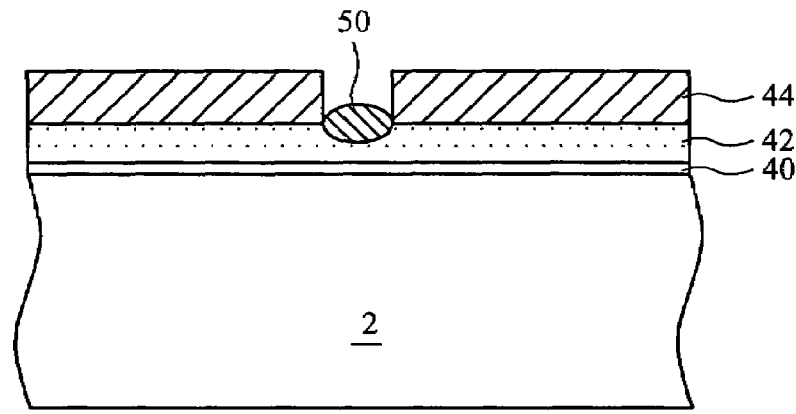
Figure 6B:
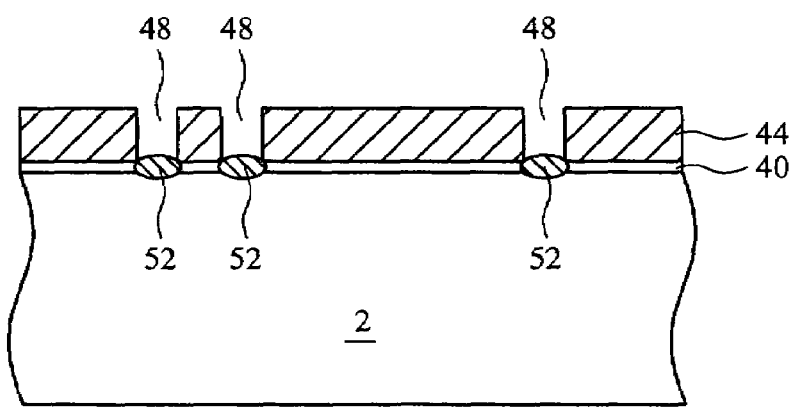

The chip is then subjected to an oxidation step, as shown in FIGS. 6A and 6B. The silicon nitride 44 oxidizes very slowly but is not penetrated by the oxygen. As a result it protects the underlying silicon from oxidizing, while allowing a thermal $SiO_2$ layer to grow on regions of exposed silicon. A gate oxide 50 (sometimes referred to herein as a thick oxide) is grown on poly silicon 42 at the same time an oxide 52 is grown on silicon substrate 2. Wet oxidation is preferably used. The oxidation may also be performed in a plasma environment. However, plasma assisted oxidation is desired to be thermal treated to enhance electric properties since the oxides 52 will be subjected to high electrical fields. The rate of the oxidation depends on the temperature, oxidation time, etc. For example, a typical oxidation at a temperature of about 1000° C. for about two to four hours can grow an oxide with a thickness of about 0.3 um to 1.0 um. Since the thick oxide 52 and the thick oxide 50 are formed simultaneously, and the performance of the flash cell is relatively insensitive to the thickness of the thick oxide 50, the thickness requirement of the thick oxide 52 dominates the oxidation process.

Now back to the discussion of poly-1 42. The thickness of the poly-1 42 depends on two factors. The first factor is the desired breakdown voltage of the HV-LDMOS, which in turn determines the thickness of the thick oxide 52, and the thickness of the thick oxide 50. Since thick oxide 50 is grown out of poly-1 42, the thicker the oxide 50, the more poly-1 42 is consumed. The second factor is the requirement of the flash cell. After oxidation, remaining poly-1 42 will become the floating gate of the flash cell. Therefore, it is desirable that poly-1 42 be formed to a thickness that equals the sum of the thickness of the flash cell floating gate and the thickness reduced by oxidation.

Thick oxide 52 increases the breakdown voltage of an LDMOS formed on it by enlarging the distance between the source/drain and the gate of the LDMOS. For example, an 800 Å to 1000 Å oxide allows the device to withstand about 30V. Further increasing the thickness of the thick oxide 52 allows the breakdown voltage to be increased to hundreds of volts. However, if the voltage is very high, the thick oxide 52 becomes very thick, and problems such as lateral diffusion become significant. Therefore the forming process needs to be controlled more carefully. It is known that different materials have different breakdown voltages, and the breakdown voltages are also affected by the forming process even when the materials are the same. For example, a slowly formed oxide has a higher breakdown voltage than a quickly formed oxide; a condensed oxide has a higher breakdown voltage than a porous oxide, and a uniform oxide has a higher breakdown voltage than a non-uniform oxide. It is desired that the process of the field oxide be carefully controlled so that higher breakdown voltages may be achieved with a thinner oxide 52.

Figure 7A:
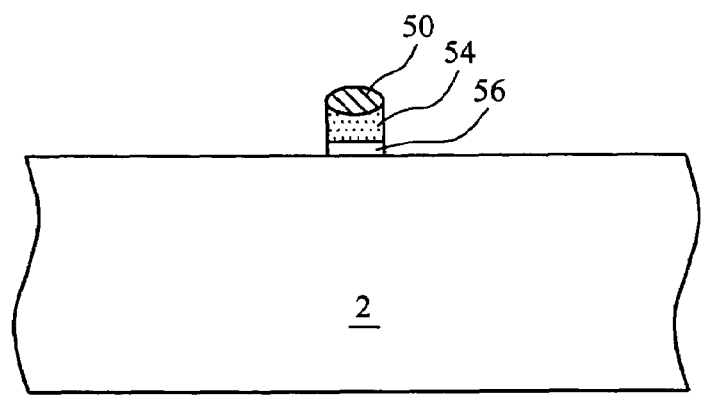
Figure 7B:
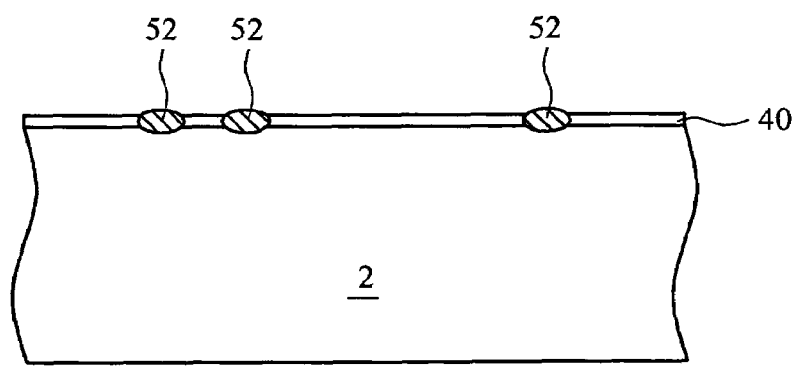

Silicon nitride 44 is then completely removed from both the flash memory region and the peripheral region simultaneously, as illustrated in FIGS. 7A and 7B. In the flash memory region, using the thick oxide 50 as a hard mask, a portion of the poly-1 42 and the first insulating layer 40 is sequentially removed to expose the surface of the substrate 2 by an etching process. The portions of the poly-1 42 and the first insulating layer 40 under the floating gate oxide 50 remain. The oxide grown on poly-1 42 becomes the floating gate oxide 50 and the remaining poly-1 42 becomes the floating gate 54 of the flash cell. The remaining oxide 40 will be denoted as the tunneling oxide 56 since, when the flash memory is written, the electrons tunnel through oxide 56 from the drain into the floating gate 54. In FIG. 7B, the thick oxide 52 and the first insulating layer 40 are exposed.

Figure 8:
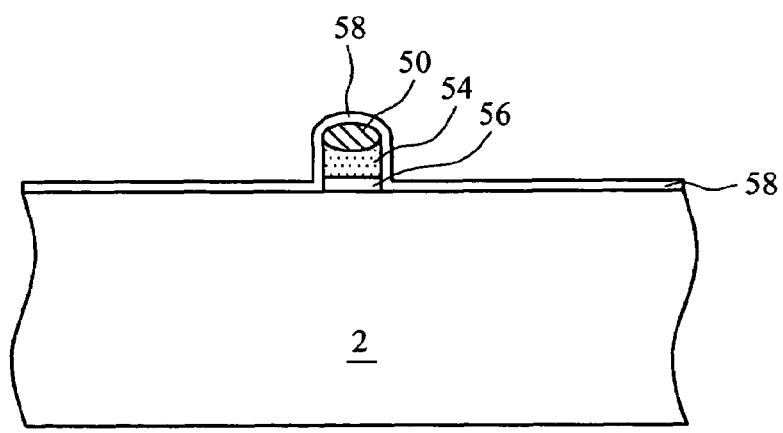
Figure 9A:
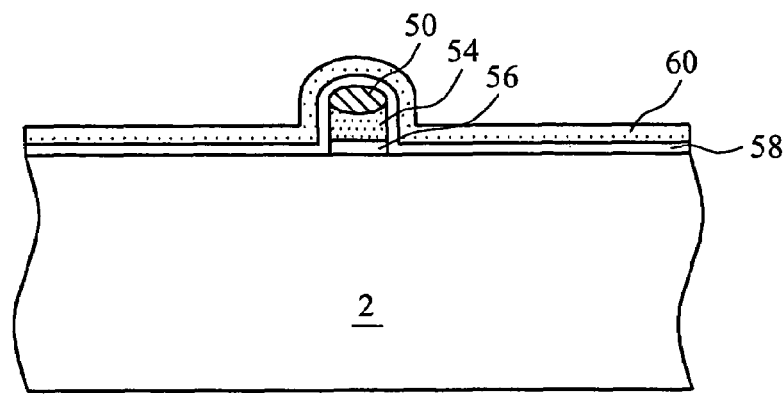
Figure 9B:
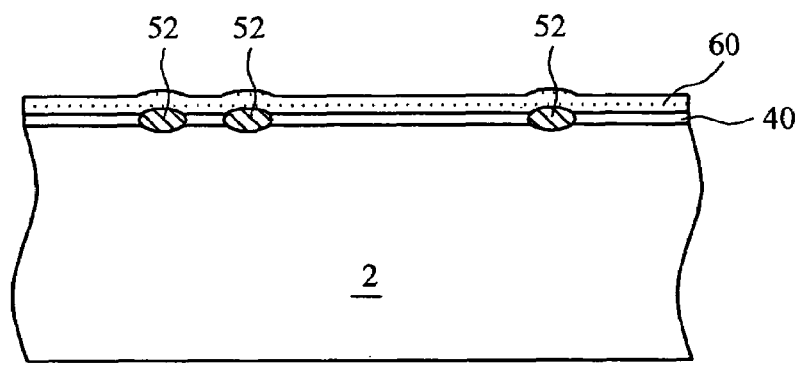

FIG. 8 illustrates a second insulating layer 58 formed on the thick oxide 50, the floating gate 54 and the tunneling oxide 56 in the flash memory region. Preferably, the second insulating layer 58 is formed to a thickness of about 50 Å to about 250 Å by oxidation or CVD. Preferably, the peripheral region is masked during this process, so that the second insulating layer 58 is not formed over the peripheral region. FIGS. 9A and 9B illustrate a conductive layer 60, preferably formed of doped poly silicon and often denoted as poly-2 60, is formed both on the second insulating layer 58 in the flash memory region and on the first insulating layer 40 and the thick oxide 52 in the peripheral region, respectively. The second conductive layer 60 typically has a thickness of about 1000 Å to 2000 Å.

Figure 10A:
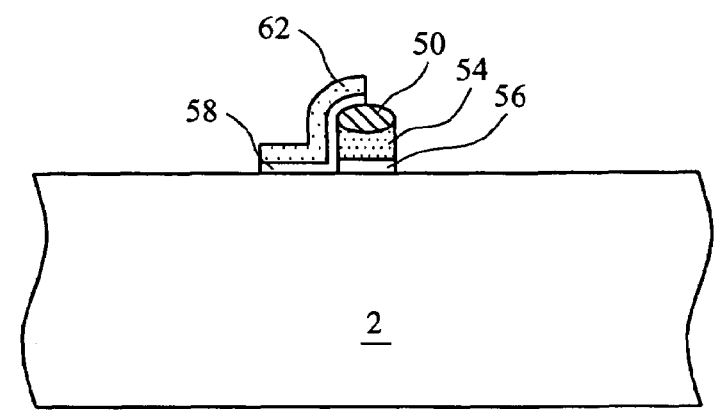

As shown in FIG. 10A, portions of the second insulating layer 58 and the second conductive layer 60 are then removed by photolithography. The remaining part of the poly-2 60 in the flash memory region forms the control gate 62 of the flash cell, and the remaining part of the second insulating layer 58 becomes the second gate-insulating layer 58 of the flash cell.

Figure 10B:
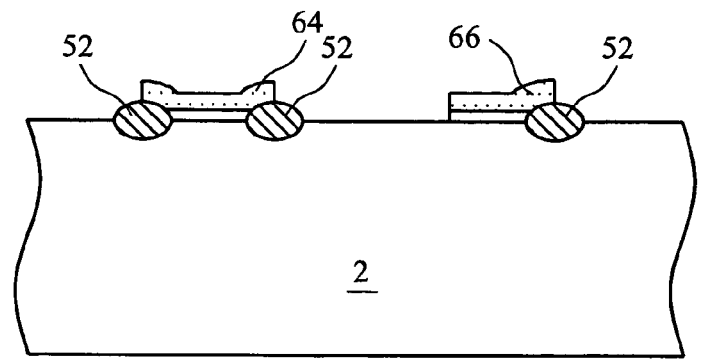

Also shown in FIG. 10B, at the time the second conductive layer 60 is removed from the flash memory region, portions of the second conductive layer 60 and the first insulating layer 40 are also removed from the peripheral region, and the remaining portions form the gate electrode of an HV-LDMOS. As discussed previously, the breakdown voltage of the LDMOS is increased by the thick oxide 52; therefore, an HV-LDMOS has at least one end of its gate electrode formed partially on a thick oxide 52. The gate electrode 64 has both its source and drain ends formed on the field oxides 52, so that the resulting HV-LDMOS has high breakdown voltages at both its drain and source ends. The gate electrode 66 has its drain end formed on a thick oxide 52, so that only the drain end has a high breakdown voltage, and the source end has a low breakdown voltage. However, an HV-LDMOS having both ends of the gate electrode formed on thick oxide 52 sustains smaller current than an HV-LDMOS having only one end of the gate electrode on the thick oxide 52.

Figure 10C:
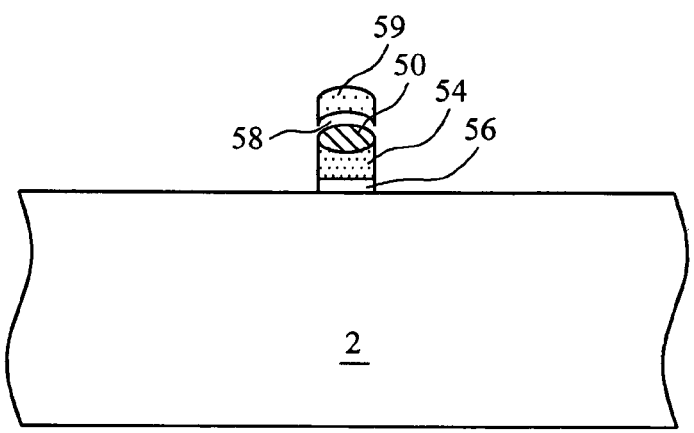

In another embodiment, a stacked gate flash cell is formed by removing the second conductive layer 60 and the second insulating layer 58 that are not on oxide 50, as illustrated in FIG. 10C. The resulting flash cell is subject to over-erase problems but has a smaller gate region than a split gate flash cell.

Figure 11A:
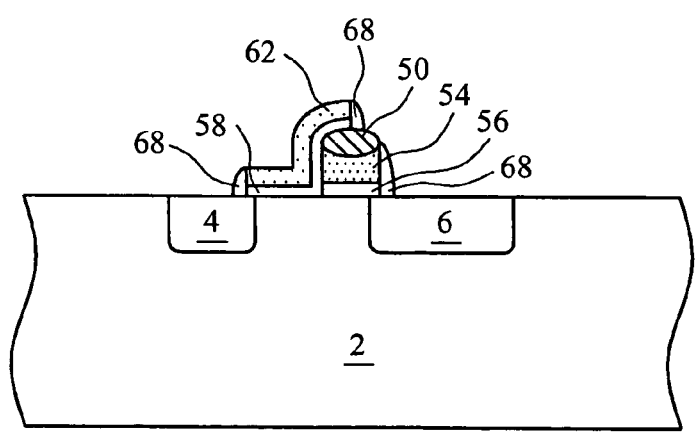
Figure 11B:
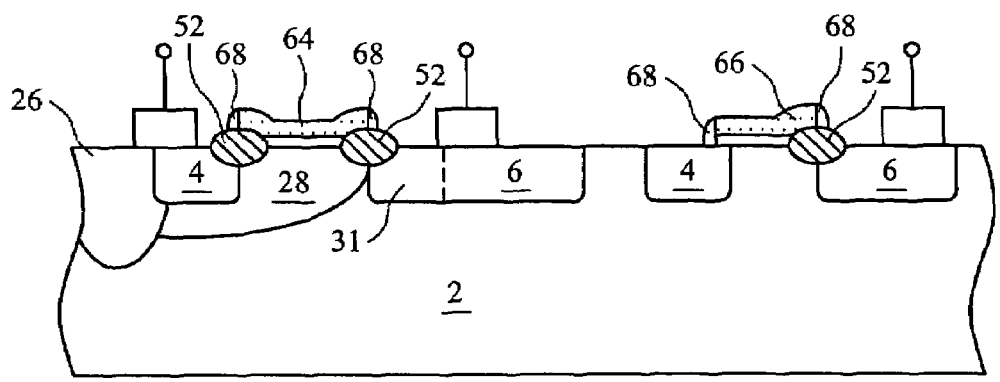

As shown in FIG. 11A and FIG. 11B, spacers 68, sinker region 26, LDD region 31, source regions 4 and drain regions 6 are then formed by implanting n or p type dopant. The formation of the flash cell and HV-LDMOS is well known in the art, therefore, the details are not discussed herein. It is to be appreciated that some steps, such as forming a source/drain for flash cells and HV-LDMOS, and forming gate spacers for flash cells and HV-LDMOS may be integrated also, and a person skilled in the art can select the most appropriate forming methods based on the requirements.

In other embodiments, the second conductive layer 60 may be formed of poly silicon in the peripheral region and used to form devices such as capacitors, resistors, high-voltage MOS, and low-voltage MOS (with neither end of the poly gate on oxide 52).

The preferred embodiments of the invention have several advantages over the prior art. First, the flash cell and the high voltage LDMOS are embedded in the same chip, so that the performance of the circuit is improved. Second, the embodiments of the present invention combine the forming of various elements for flash cells and peripheral devices in order to lower the production cost. Third, the flash memory usually needs high voltage circuits to write, erase, and read, and an HV-LDMOS built using embodiments of the present invention has breakdown voltages well above 15V. Through increasing the thickness of the field oxide, the breakdown voltage can be adjusted in a wide range. By using the HV-LDMOS to replace conventional high voltage circuits, the circuit has better reliability under repeated memory cycles.

Figure 12:
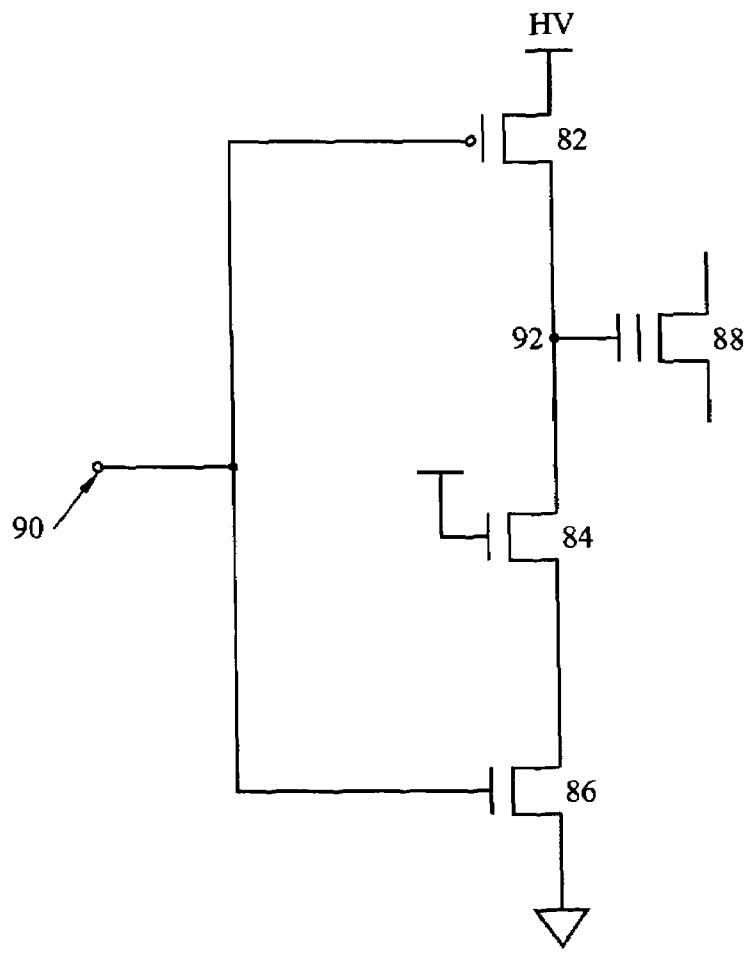
FIG. 12 is a schematic view of a conventional x-decoder circuit of the flash memory.
Figure 13:
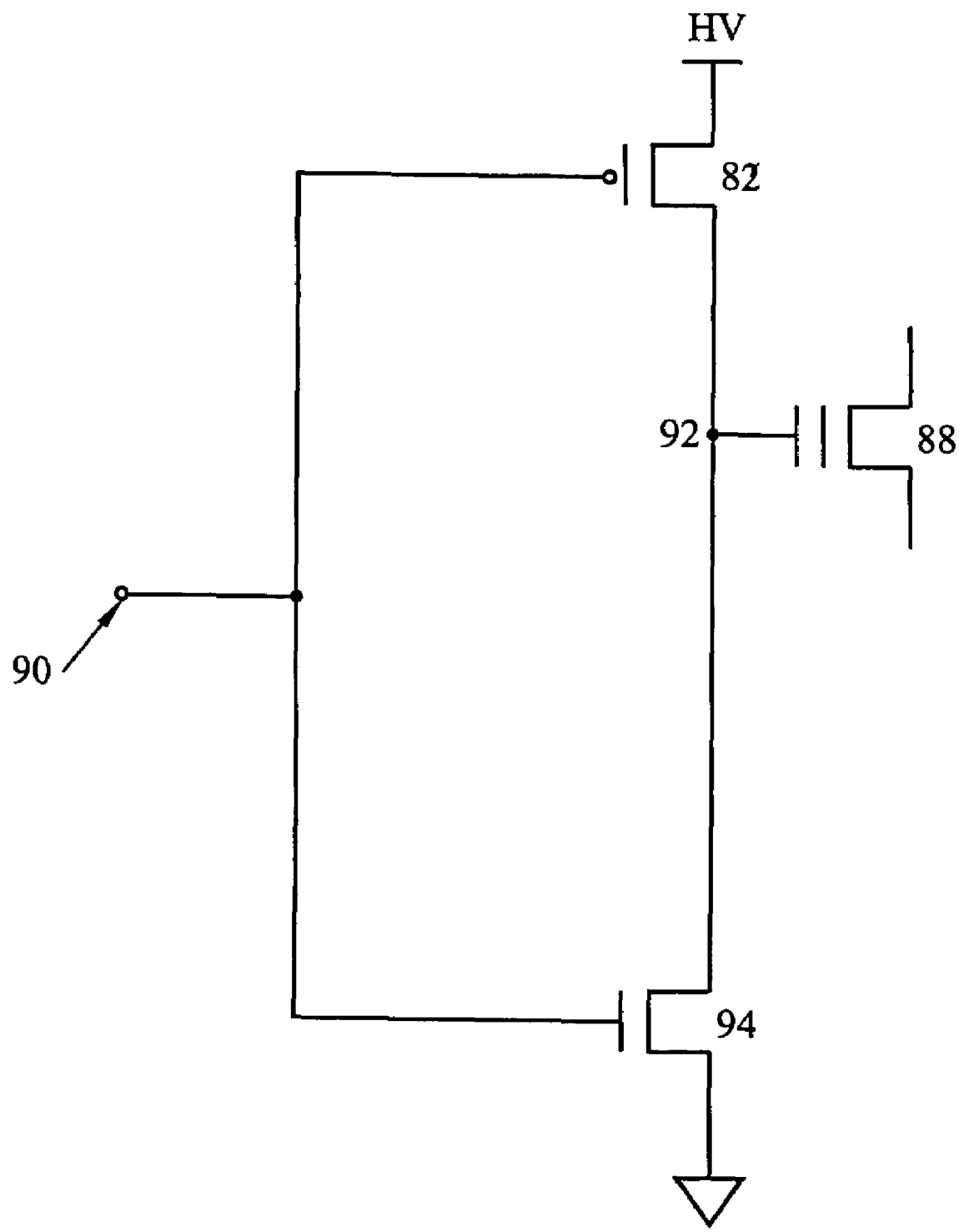
FIG. 13 is a schematic view of a preferred embodiment of the present invention used for an x-decoder circuit.

FIGS. 12 and 13 illustrate an application of the present invention. FIG. 12 is a conventional x-decoder (decoder in the x direction of the flash memory array) circuit. Device 82 is a high voltage pMOS and devices 84 and 86 are high voltage nMOS devices. Typically, for an erase operation, a voltage of 13V may be applied at node 92. In other kinds of flash memories, the high voltage values used for program or erase operations may go as high as 25V. Since many cycles of read and write operations may be performed in the flash cell 88, the devices 84 and 86 may be under high voltage stress for many cycles. That is why the high voltage nMOS 84 is cascaded with a high voltage nMOS 86 so that each of the devices is subject to only half the voltage, and the reliability is improved. FIG. 13 illustrates a circuit using the embodiments of the present invention. The high voltage nMOS 84 and 86 are replaced with an HV-LDMOS 94 formed by the embodiments of the present invention. Since HV-LDMOS 94 has a higher breakdown voltage and its breakdown voltage can be designed well above the voltage applied, it is more reliable. It is observed that by using the embodiments of the present invention, fewer devices are needed so that less chip area is used.

It is to be appreciated that throughout the description, the HV-LDMOS is preferred. However, the present invention is not limited to forming the HV-LDMOS in the peripheral region. Any MOS device that may be subject to high voltages may be formed using the embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit comprising the steps of:
    forming a first structure at a first region of a substrate wherein the first structure comprises a first insulating layer formed on the substrate, and a poly silicon feature formed on the first insulating layer;
    forming a second insulating layer at a second region of the substrate, the second insulating layer having an opening formed therein;
    forming a first thick oxide on the poly silicon feature and simultaneously forming a second thick oxide in the opening of the second insulating layer;
    forming a first conductive feature over at least a portion of the first thick oxide, and simultaneously forming a second conductive feature physically separated from the first conductive feature, wherein the second conductive feature is over a portion of the second insulating layer, and wherein at least one end of the second conductive feature is over a portion of the second thick oxide;
    forming a first source and a first drain at the first region and a second source and a second drain at the second region;
    forming a first spacer along a sidewall of the first conductive feature, the polysilicon feature and the first thick oxide; and
    forming a second spacer along sidewall of the second conductive feature.

2. The method of claim 1 further comprising the steps of:
    forming a drift region at the second region of the substrate;
    forming a lightly doped drain region adjacent the second drain at the second region; and
    forming a source sinker region adjacent the second source at the second region.

3. The method of claim 1 wherein the step of forming a first thick oxide on the poly silicon feature and simultaneously forming a second thick oxide in the opening of the second insulating layer comprises:
    forming a first mask layer on the poly silicon feature at the first location;
    forming a second mask layer on the second insulating layer at the second location;
    forming a first opening in the first mask layer to expose the poly silicon feature;
    forming a second opening in the second mask layer and the second insulating layer to expose the substrate;
    exposing the exposed poly silicon feature and the exposed substrate to an oxygen source;
    removing the first mask layer; and
    removing the second mask layer.

4. The method of claim 3 wherein the first mask layer and the second mask layer are the same silicon nitride layer formed at the same time.

5. The method of claim 1 wherein the first insulating layer and the second insulating layer are the same layer formed at the same time.

6. The method of claim 5 wherein the first insulating layer and the second insulating layer are formed by thermal oxidation.

7. The method of claim 1 wherein the first insulating layer has a thickness of about 60 Å to about 110 Å.

8. The method of claim 1 wherein the substrate comprises silicon.

9. The method of claim 1 wherein a portion of the first conductive feature is not over the first thick oxide.

10. The method of claim 1 wherein the first thick oxide and the second thick oxide are formed by local oxidation of silicon (LOCOS).

11. The method of claim 1 further comprising the step of:
    forming a compound structure at the second region wherein the compound structure comprises the second insulating layer over the substrate and the second conductive feature over the second insulating layer, and wherein the compound structure is not formed on the second thick oxide.

12. The method of claim 11 further comprising the step of patterning the second conductive feature to form a resistor.

13. The method of claim 12 further comprising the steps of:
    forming a third spacer along a sidewall of the second conductive feature and the second insulating layer; and
    farming a third source and a third drain region adjacent the third spacer.

14. The method of claim 13 further comprising the step of connecting the third source and the third drain to form a capacitor.

15. A method of forming an integrated circuit comprising the steps of:

forming a first insulating layer at a first location and a second location of a silicon substrate;

forming a poly silicon feature on the first insulating layer at the first location;

forming a mask layer over the poly silicon feature and the first insulating layer;

forming a first opening in the mask layer at the first location to expose the first poly silicon feature, and forming a second opening in the mask layer and the first insulating layer to expose the silicon substrate at the second location;

forming a first thick oxide on the exposed poly silicon feature and in the first opening;

forming a second thick oxide on the exposed silicon substrate and in the second opening;

selectively removing the poly silicon and the first insulating layer not covered by the first thick oxide;

forming a second insulating layer at the first location;

forming a conductive layer at the first location and the second location;

at the first location, removing portions of the conductive layer and the second insulating layer, such that a remaining conductive layer and a remaining second insulating layer in the first region each have a portion over the first thick oxide;

at the second location, removing portions of the conductive layer and the first insulating layer, such that a remaining conductive layer in the second location has at least one end over a portion of the second thick oxide and extending over part of the first insulating layer, wherein the remaining conductive layer in the first location is electrically disconnected from the remaining conductive layer in the second location;

forming a source and a drain in the first location of the silicon substrate;

forming a spacer along a sidewall of the remaining conductive layer at the first location; and forming a spacer along a sidewall of the remaining conductive layer and the thick oxide at the second location.

16. The method of claim 15 wherein the first opening and the second opening are formed simultaneously.

17. The method of claim 15 wherein after the step of removing portions of the conductive layer and the second insulating layer, the remaining conductive layer and second insulating layer are coterminous with the poly silicon remaining after the step of selectively removing the poly silicon and the first insulating layer not covered by the thick oxide at the first location.

18. The method of claim 15 wherein after the step of removing portions of the conductive layer and the second insulating layer, a portion of the remaining conductive layer extends beyond the poly silicon remaining after the step of selectively removing the poly silicon and the first insulating layer not covered by the thick oxide at the first location.

19. The method of claim 15 wherein the first insulating layer has a thickness of about 60 Å to about 110 Å.

20. The method of claim 15 wherein the first and the second thick oxides are formed by local oxidation of silicon (LOCOS).

21. The method of claim 1, wherein the second conductive feature further comprises a second horizontal portion physically connected to the vertical portion, wherein the second conductive feature is over the poly silicon feature.

22. The method of claim 1, wherein after the step of forming the first structure, the second region is free from the poly silicon feature.

23. The method of claim 1, wherein the first and the second insulating layers are a same layer.

24. The method of claim 15, wherein after the step of forming the poly silicon on the first insulating layer, the second location is free from the poly silicon.

25. A method of forming an integrated circuit comprising the steps of:

forming a first structure at a first region of a substrate wherein the first structure comprises a first insulating layer formed on the substrate, and a poly silicon feature formed on the first insulating layer;

forming a second insulating layer at a second region of the substrate, the second insulating layer having an opening formed therein;

forming a first thick oxide on the poly silicon feature and simultaneously forming a second thick oxide in the opening of the second insulating layer;

forming a first conductive feature over at least a portion of the first thick oxide, and simultaneously forming a second conductive feature, wherein the first feature has a vertical portion on a sidewall of the poly silicon feature and a sidewall of the first thick oxide, and a horizontal portion extending away from the poly silicon feature, and wherein the first and the second conductive features are physically separated and are each continuous;

forming a first source and a first drain at the first region and a second source and a second drain at the second region;

forming a first spacer along a sidewall of the first conductive feature, the polysilicon feature and the first thick oxide; end forming a second spacer along a sidewall of the second conductive feature.

26. The method of claim 25 further comprising the steps of:

forming a drift region at the second region of the substrate;

forming a lightly doped drain region adjacent the second drain at the second region; and forming a source sinker region adjacent the second source at the second region.

27. The method of claim 25, wherein the step of forming a first thick oxide on the poiy silicon feature and simultaneously forming a second thick oxide in the opening of the second insulating layer comprises:

forming a first mask layer on the poly silicon feature at the first location;

forming a second mask layer on the second insulating layer at the second location;

forming a first opening in the first mask layer to expose the poly silicon feature;

forming a second opening in the second mask layer and the second insulating layer to expose the substrate;

exposing the exposed poly silicon feature and the exposed substrate to an oxygen source;

removing the first mask layer; and removing the second mask layer.

* * * * *

UNITED STATES PATENT AND TRADEMARK OFFICE
CERTIFICATE OF CORRECTION

PATENT NO. : 7,282,410 B2
APPLICATION NO. : 10/895881
DATED : October 16, 2007
INVENTOR(S) : Lu et al.

It is certified that error appears in the above-identified patent and that said Letters Patent is hereby corrected as shown below:

On the Title Page, Item (56) References Cited, OTHER PUBLICATIONS, delete "An1226" and insert --AN1226--.
In Col. 8, line 4, delete "along" and insert --along a--.
In Col. 8, line 61, delete "farming" and insert --forming--.
In Col. 10, line 35, delete "end" and insert --and--.
In Col. 10, line 47, delete "poiy" and insert --poly--.

Signed and Sealed this

Twenty-fifth Day of December, 2007

JON W. DUDAS
*Director of the United States Patent and Trademark Office*